United States Patent
Fisch et al.

(10) Patent No.: US 7,619,944 B2
(45) Date of Patent: Nov. 17, 2009

(54) METHOD AND APPARATUS FOR VARIABLE MEMORY CELL REFRESH

(75) Inventors: David Fisch, St-Sulpice (CH); Eric Carman, Cernex (FR)

(73) Assignee: Innovative Silicon ISi SA, Lausanne (CH)

( * ) Notice: Subject to any disclaimer, the term of this patent is extended or adjusted under 35 U.S.C. 154(b) by 166 days.

(21) Appl. No.: 11/650,101

(22) Filed: Jan. 5, 2007

(65) Prior Publication Data
US 2008/0165605 A1 Jul. 10, 2008

(51) Int. Cl.
*G11C 7/00* (2006.01)
(52) U.S. Cl. .................. 365/222; 365/191; 365/233.11; 365/238.5; 365/241
(58) Field of Classification Search .................. 365/222, 365/191, 238.5, 233.11, 241
See application file for complete search history.

(56) References Cited

U.S. PATENT DOCUMENTS

| | | | |
|---|---|---|---|
| 4,716,551 A | 12/1987 | Inagaki | |
| 5,122,988 A | 6/1992 | Graeve | |
| 5,295,110 A * | 3/1994 | Sakakibara | 365/222 |
| 5,487,157 A | 1/1996 | Mizugaki | |
| 5,644,545 A | 7/1997 | Fisch | |
| 6,097,658 A | 8/2000 | Satoh et al. | |
| 6,735,139 B2 | 5/2004 | Tang | |
| 6,744,684 B2 | 6/2004 | Arimoto et al. | |
| 6,765,839 B2 * | 7/2004 | Park | 365/222 |
| 6,847,573 B2 | 1/2005 | Lee et al. | |
| 6,909,658 B2 | 6/2005 | Arimoto et al. | |
| 6,940,851 B2 | 9/2005 | Oki et al. | |
| 6,969,662 B2 | 11/2005 | Fazan et al. | |
| 7,230,846 B2 | 6/2007 | Keshavarzi et al. | |

* cited by examiner

*Primary Examiner*—Pho M. Luu
(74) *Attorney, Agent, or Firm*—Courtney, Staniford & Gregory LLP

(57) ABSTRACT

Devices allow a system using a memory array, or the memory itself, to more efficiently control refresh intervals. This reduces standby current and the overhead associated with refresh operations. The device includes a variable analog refresh signal generation circuit that initiates a refresh operation on one or more memory cells of a memory array. The circuit integrates a refresh timer element with an event signal generator such that a refresh interval as defined by the refresh timer element is changed when events are detected that may change the data retention time of one or more memory cells. One or more of the circuits is placed to monitor an entire memory array, different sub-arrays, or different portions of different sub-arrays. This allows additional refresh operations to be closely tied to actual events, thus increasing overall efficiency.

28 Claims, 14 Drawing Sheets

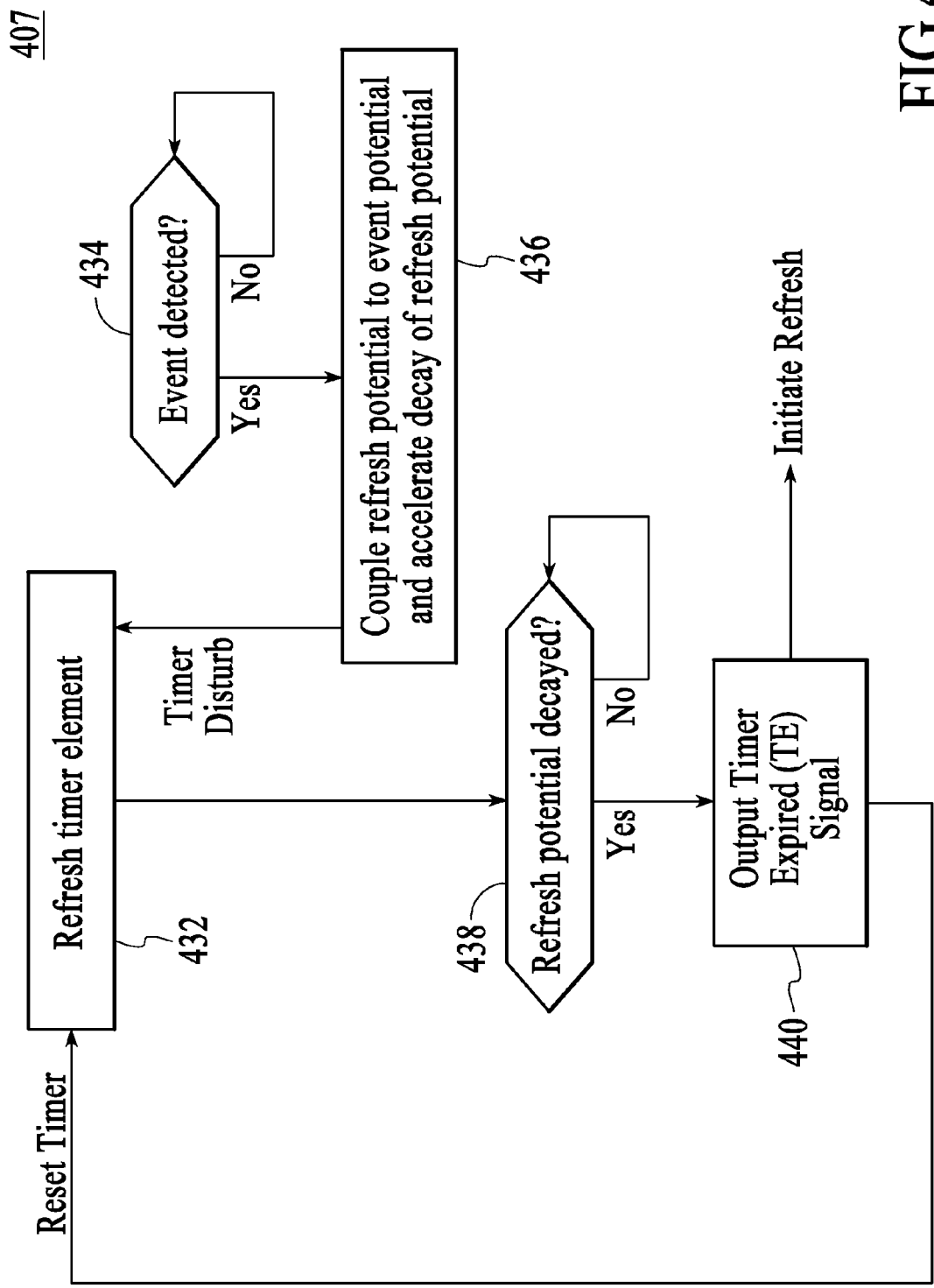

METHOD AND APPARATUS FOR VARIABLE MEMORY CELL REFRESH

TECHNICAL FIELD

The disclosure herein relates generally to semiconductor memories.

BACKGROUND

The inventions relate to a semiconductor memory cell, array, architecture and device, and techniques for controlling and/or operating such cell, array and device; and more particularly, in one aspect, to a dynamic random access memory ("DRAM") cell, array, architecture and device, wherein the memory cell includes an electrically floating body wherein an electrical charge is stored therein.

There is a continuing trend to employ and/or fabricate advanced integrated circuits using techniques, materials and devices that improve performance, reduce leakage current and enhance overall scaling. Semiconductor-on-Insulator (SOI) is a material in which such devices may be fabricated or disposed on or in (hereinafter collectively "on"). Such devices are known as SOI devices and include, for example, partially depleted (PD), fully depleted (FD) devices, multiple gate devices (for example, double or triple gate), and Fin-FET.

One type of dynamic random access memory cell is based on, among other things, the electrically floating body effect of SOI transistors. (See, for example, U.S. Pat. No. 6,969,662, incorporated herein by reference). In this regard, the dynamic random access memory cell may consist of a PD or a FD SOI transistor (or transistor formed in bulk material/substrate) having a channel, which is disposed adjacent to the body. The body region of the transistor is electrically floating in view of the insulation layer (or non-conductive region, for example, in a bulk-type material/substrate) disposed beneath the body region. The state of memory cell is determined by the concentration of charge within the body region of the SOI transistor.

With reference to FIGS. 1A, 1B and 1C, in one embodiment, semiconductor DRAM array 10 includes a plurality of memory cells 12 each consisting of transistor 14 having gate 16, body region 18, which is electrically floating, source region 20 and drain region 22. The body region 18 is disposed between source region 20 and drain region 22. Moreover, body region 18 is disposed on or above region 24, which may be an insulation region (for example, in an SOI material/substrate) or non-conductive region (for example, in a bulk-type material/substrate). The insulation or non-conductive region 24 may be disposed on substrate 26.

Data is written into or read from a selected memory cell by applying suitable control signals to a selected word line(s) 28, a selected source line(s) 30 and/or a selected bit line(s) 32. In response, charge carriers are accumulated in or emitted and/or ejected from electrically floating body region 18 wherein the data states are defined by the amount of carriers within electrically floating body region 18. Notably, the entire contents of the '662 patent, including, for example, the features, attributes, architectures, configurations, materials, techniques and advantages described and illustrated therein, are incorporated by reference herein.

As mentioned above, memory cell 12 of DRAM array 10 operates by accumulating in or emitting/ejecting majority carriers (electrons or holes) 34 from body region 18 of, for example, N-channel transistors. (See, FIGS. 2A and 2B). In this regard, accumulating majority carriers (in this example, "holes") 34 in body region 18 of memory cells 12 via, for example, impact ionization near source region 20 and/or drain region 22, is representative of a logic high or "1" data state. (See, FIG. 2A). Emitting or ejecting majority carriers 34 from body region 18 via, for example, forward biasing the source/body junction and/or the drain/body junction, is representative of a logic low or "0" data state. (See, FIG. 2B).

Notably, for at least the purposes of this discussion, a logic high or State "1" corresponds to an increased concentration of majority carriers in the body region relative to an unprogrammed device and/or a device that is programmed with a logic low or State "0". In contrast, a logic low or State "0" corresponds to a reduced concentration of majority carriers in the body region relative to an unprogrammed device and/or a device that is programmed with logic high or State "1".

Conventional reading is performed by applying a small drain bias and a gate bias above the transistor threshold voltage. The sensed drain current is determined by the charge stored in the floating body giving a possibility to distinguish between the states "1" and "0". A floating body memory device has two different current states corresponding to the two different logical states: "1" and "0".

In one conventional technique, the memory cell is read by applying a small bias to the drain of the transistor as well as a gate bias which is above the threshold voltage of the transistor. In this regard, in the context of memory cells employing N-type transistors, a positive voltage is applied to one or more word lines 28 to enable the reading of the memory cells associated with such word lines. The amount of drain current is determined/affected by the charge stored in the electrically floating body region of the transistor. As such, some conventional reading techniques sense the amount of the channel current provided/generated in response to the application of a predetermined voltage on the gate of the transistor of the memory cell to determine the state of the memory cell; a floating body memory cell may have two or more different current states corresponding to two or more different logical states (for example, two different current conditions/states corresponding to the two different logical states: "1" and "0"). Other reading techniques are in use.

In the case of a DRAM cell, either with or without a floating body, the memory cell or element is dynamic, meaning that the data state must be periodically sensed and restored or refreshed to maintain data integrity. Often this is done by using on-chip or off-chip timers to initiate a refresh operation at regular intervals. A disadvantage of this approach is that the refresh interval required to refresh a memory cell array is typically not a constant. The refresh interval required to maintain data integrity can be affected by many things including temperature variations, power-supply noise and operation of the array. For example, when dynamic memory elements are placed in an array, they are typically accessed by wordlines (row), sourcelines (row or column) and or bitlines (column) lines. The row address activates a wordline which allows the contents of the memory cells to be communicated to bitlines. This process can partially disturb the content of un-addressed cells, typically due to either capacitive coupling to neighboring wordlines, or in cross-point arrays, due to voltage variations on the bitlines and or wordlines. This process can also partially disturb the content of addressed cells or partially addressed cells. As such, the operation of an array can constitute disturb events, or "disturbs", that reduce the data retention time of un-accessed cells in the active array. With dynamic memories, disturbs typically remove a signal amount that is proportional to the amount of signal remaining.

One conventional solution is to set the refresh timers for an array to a shorter interval to compensate for worst case disturbs. One disadvantage of this solution is that in low power applications this leads to higher standby current than might be necessary when disturbs to an array are not occurring. Another disadvantage of this solution is that in high performance applications, the refresh operation will typically consume a larger percentage of the available operation bandwidth and may reduce the performance capability of the product.

Another possible solution is to have two separate counters (one for time and one for disturb events) and digitally integrate the two. However, this solution would add significant complexity and cost due to additional digital logic. In addition, this solution does not lend itself well to physically tracking disturbs with respect to the memory cell retention, which is necessary for optimum efficiency.

Yet another approach includes two counters, each of which is set with conservative margins. When either timer expires, a refresh operation is initiated. However, this approach could result in failed memory cells in cases where multiple disturbs occur near the end of the timer period. Conversely, this approach could lead to higher power consumption in the event that no disturbs or many disturbs occur.

FIG. 3A is a schematic diagram of a prior art refresh timer 300. The timer 300 is an analog timer that generates a timer expired (TE) signal 304 after the expiration of an interval that is fixed by the time it takes a stored potential C1a to decay to a predetermined level Vt. The refresh timer 300 includes a switch SWp 308 connected to a voltage V1, which is typically a power supply voltage. A capacitor C1 310 is charged by voltage V1 through switch SWp 308. The capacitor C1 310 is connected through a node C1a to a resistor 306, switch SWp 308, and the input of a logic gate threshold voltage (Vt) detect 302. The potential C1a decays through resistor 306 to potential V2, typically ground. When the potential C1a on C1 310 decays to Vt, the logic gate 302 outputs TE signal 304. Logic gate 302 can be an inverter, for example. TE signal 304 initiates a refresh operation on a memory cell or group of memory cells. The interval between refresh operations is determined by the design of the refresh timer 300 and is not variable.

FIG. 3B illustrates the operation of the refresh timer 300. A signal level (in arbitrary units) is shown on the vertical axis, and time (in arbitrary units) is shown on the horizontal axis. A trigger threshold voltage, Vt, is marked as the first delineation of the vertical signal axis. Looking from the left to the right on the diagram, a potential level of C1 310 (the potential at node C1a) is shown decaying from an initial high level until it reaches Vt. The timer expired signal TE 304 is fired when the voltage at C1a reaches Vt. Also, the refresh timer is reset when the voltage at C1a reaches Vt. This involves recharging capacitor C1 through switch SWp. As shown in FIG. 3B, the interval between timer reset events is fixed. This does not allow for flexibility to reduce the refresh interval when events occur that may reduce the period during which the data integrity of a memory cell can be guaranteed. As a consequence, the fixed interval is typically required to be relatively short to allow for worst-case scenarios, thus usually consuming more power than actually required.

It would be advantageous to have a method and apparatus that efficiently integrates both time and disturb events, and shortens the interval between refresh operations only when and where required. As described above, dynamic memories typically require refresh timers that will fire a 'refresh needed' signal. It is desired that this signal occur more frequently if disturb events occur, such as repeated wordline accesses to neighboring wordlines. In addition it is desirable for the effect of a disturb on the refresh timer to closely track the effect of the disturb on the structures being monitored.

INCORPORATION BY REFERENCE

Each publication and patent application mentioned in this specification is herein incorporated by reference in its entirety to the same extent as if each individual publication or patent application was specifically and individually indicated to be incorporated by reference.

BRIEF DESCRIPTION OF THE DRAWINGS

In the course of the detailed description to follow, reference will be made to the attached drawings. These drawings show different aspects of the present inventions and, where appropriate, reference numerals illustrating like structures, components, materials and/or elements in different figures are labeled similarly. It is understood that various combinations of the structures, components, materials and/or elements, other than those specifically shown, are contemplated and are within the scope of the present inventions.

Moreover, there are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, many of those permutations and combinations will not be discussed separately herein.

FIG. 4C is a flow diagram of a method for initiating a refresh operation on one or more memory cells, according to an embodiment;

FIGS. 8A and 8B are block diagram illustrations of example devices in which the present embodiments may be implemented wherein FIG. 8A is a logic device (having logic circuitry and resident memory) and FIG. 8B is a memory device (including primarily one or more memory arrays), according to certain aspects of the present embodiments.

DETAILED DESCRIPTION

There are many inventions described and illustrated herein. The embodiments described herein allow tracking of both time and disturb events using relatively simple circuitry that consumes very little semiconductor area or power. The embodiments described herein allow a system using a memory array, or the memory itself, to more efficiently control refresh intervals. This reduces standby current and the overhead associated with refresh operations. One embodiment includes a variable analog refresh signal generation circuit that initiates a refresh operation on one or more memory cells of a memory array. The circuit integrates a refresh timer element with an event signal generator such that a refresh interval as defined by the refresh timer element is shortened when events are detected that may reduce the data retention time of one or more memory cells. In various embodiments, one or more of the circuits is placed to monitor an entire memory array, different sub-arrays, or different portions of different sub-arrays. This allows additional refresh operations to be closely tied to actual events, thus increasing overall efficiency.

In one embodiment of the present inventions, each memory cell includes at least one electrically floating body transistor, but the claimed inventions are suitable for any other type of memory. Although the embodiments illustrated and described herein for the purpose of disclosing the claimed invention include a dynamic memory, embodiments are not so limited. The embodiments described and claimed are suitable for refresh operations on certain static memories as well, such as portable universal serial bus (USB) flash memory "sticks" that have long, but finite data integrity periods.

The embodiments illustrated and described herein include refresh signal generation circuits in a memory array (on-chip). Alternatively, all or portions of the described circuitry can be located off-chip.

Embodiments are described with reference to a refresh operation on one or more memory cells. A refresh operation as used herein also refers to restore operations, replenishment operations, or any other terminology that indicates operation to a cell to assure the data integrity of the cell.

Figure 4A:
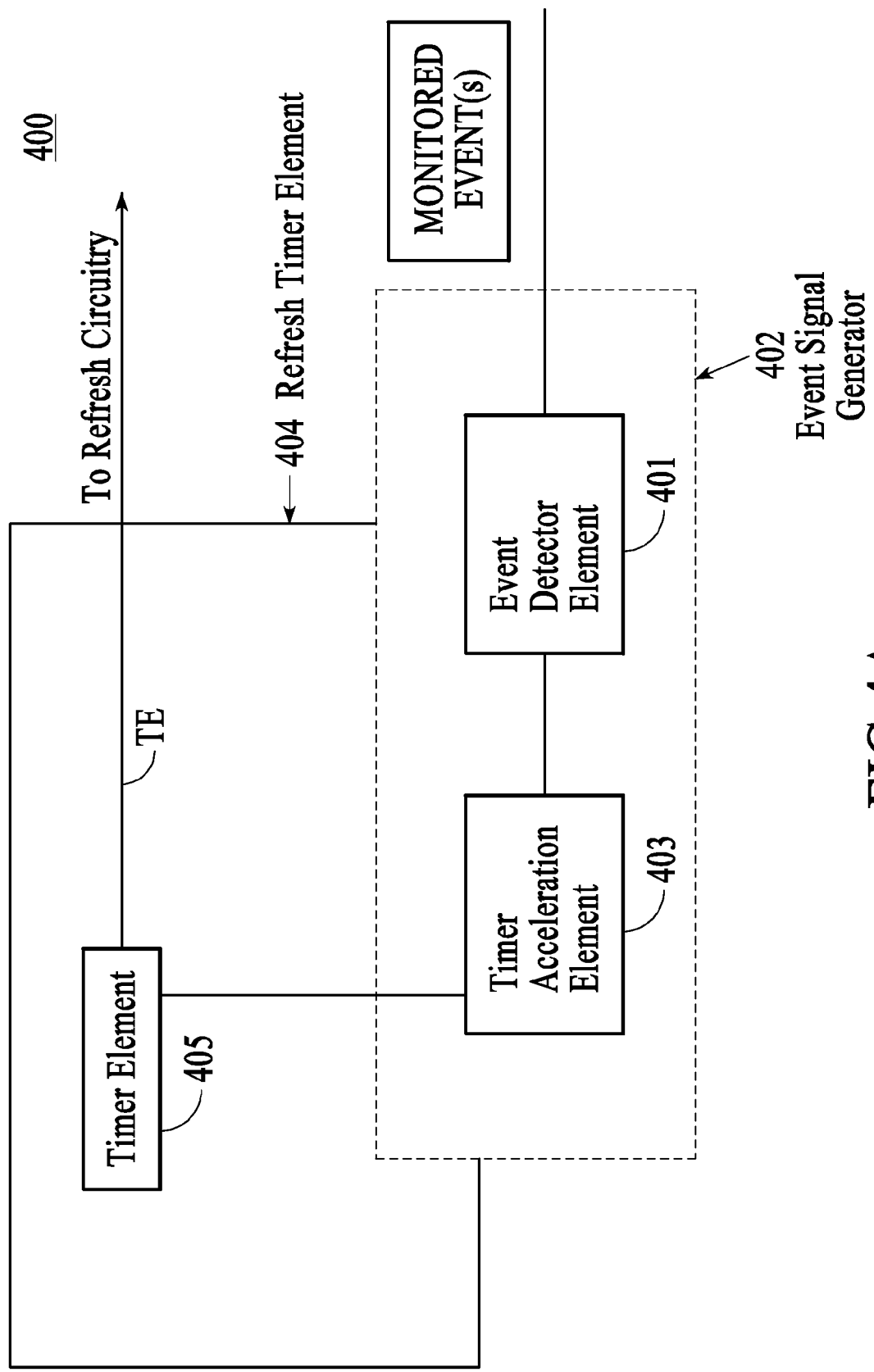
FIG. 4A is a block diagram of a variable memory refresh signal generation circuit, according to an embodiment.

FIG. 4A is a schematic diagram of a variable memory refresh signal generation circuit 400, according to an embodiment. Circuit 400 includes a refresh timer element 404 and an event signal generator 402. Refresh timer element 404 contains a timer element 405 that operates to generate a timer expired (TE) signal that initiates a refresh operation to one or more memory cells.

Event signal generator 402 includes an event detector element 401 and a timer acceleration element 403. Event signal generator 402 detects events that may reduce the data retention time of one or more memory cells. When an event is detected, event signal generator 402 is coupled to refresh timer element 404 such that a refresh interval (which is determined by the design of refresh timer element 404) is shortened.

Figure 4B:
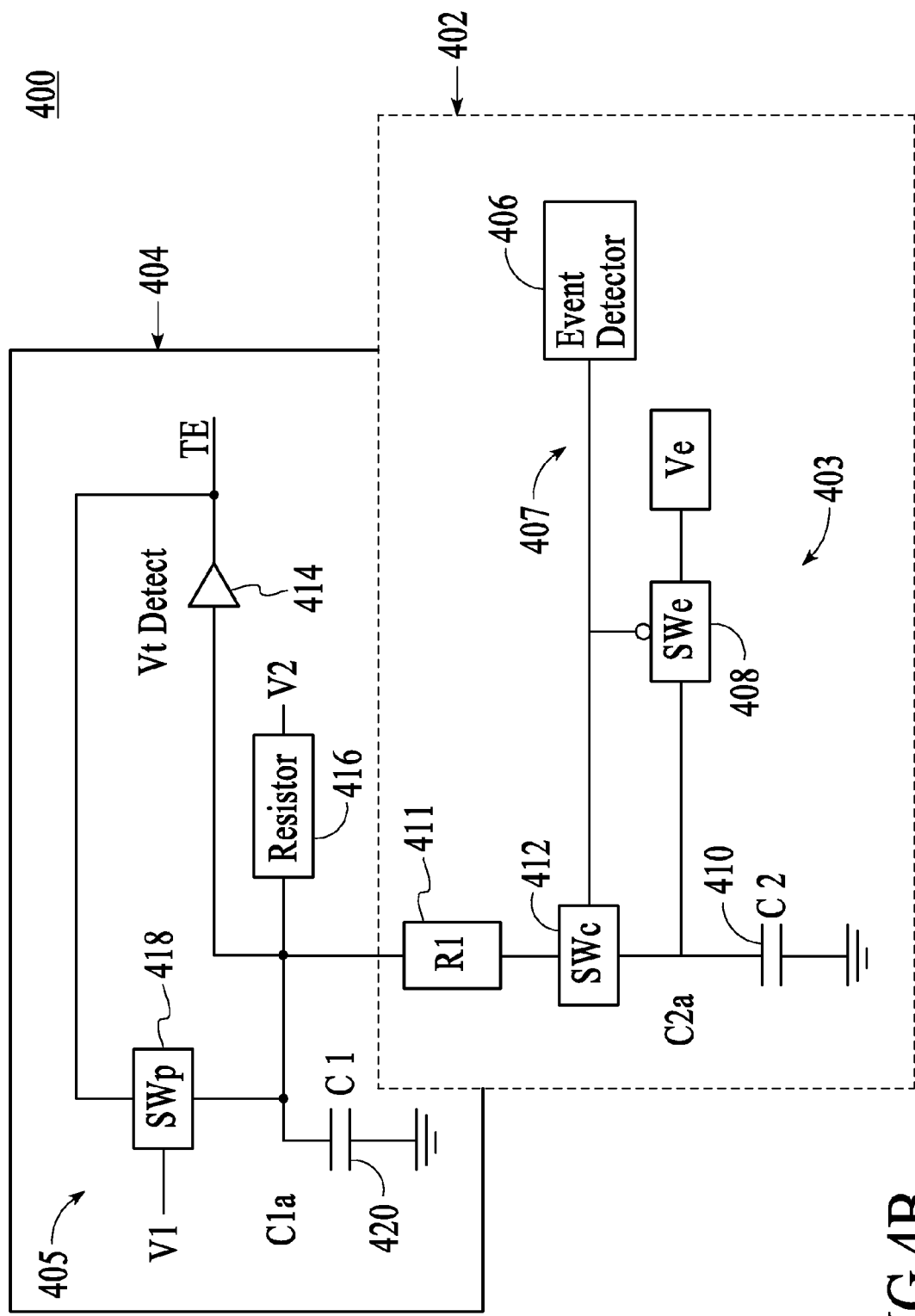
FIG. 4B is a schematic diagram of a variable memory refresh signal generation circuit, according to an embodiment.

FIG. 4B is a schematic diagram of the variable memory refresh signal generation circuit 400, according to an embodiment. Circuit 400 includes refresh timer element 404 and event signal generator 402. Refresh timer element 404 operates to generate a timer expired (TE) signal that initiates a refresh operation to one or more memory cells. Event signal generator 402 detects events that may reduce the data retention time of one or more memory cells. When an event is detected, event signal generator 402 is coupled to refresh timer element 404 such that a refresh interval (which is determined by the design of refresh timer element 404) is shortened.

Figure 1A:
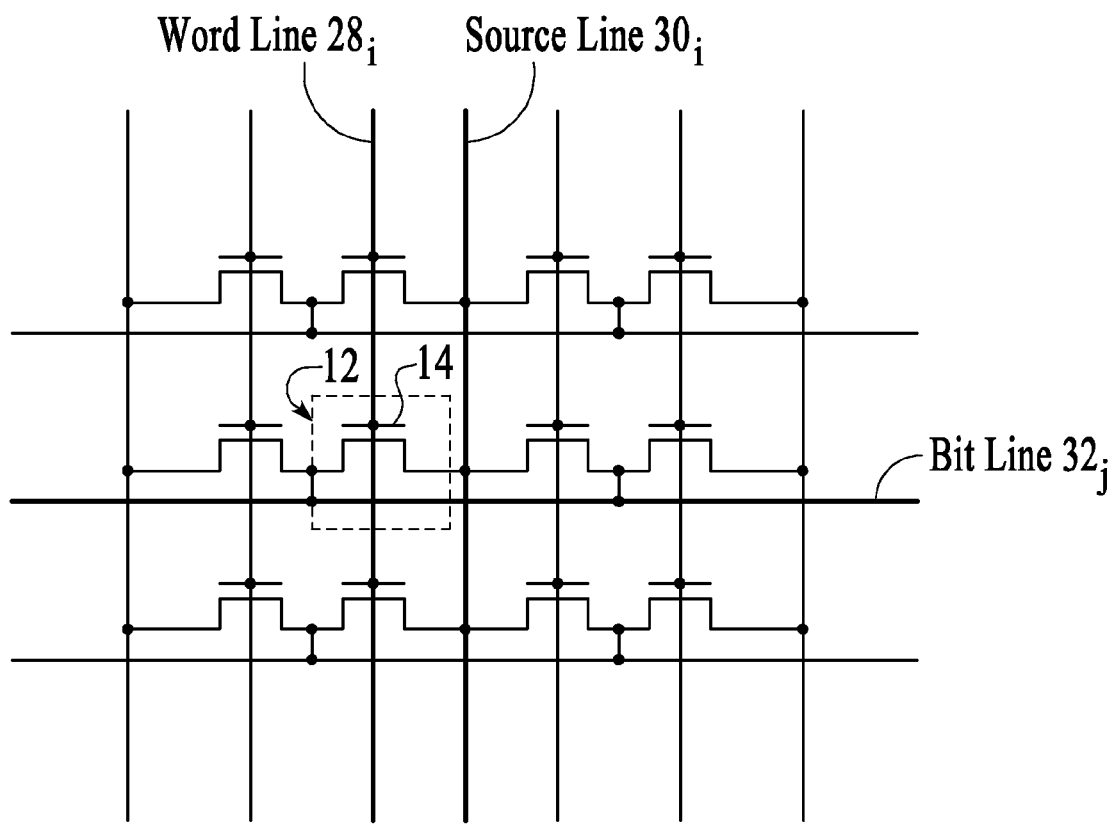
FIG. 1A is a schematic representation of a prior art DRAM array including a plurality of memory cells comprised of one electrically floating body transistor.
Figure 1B:
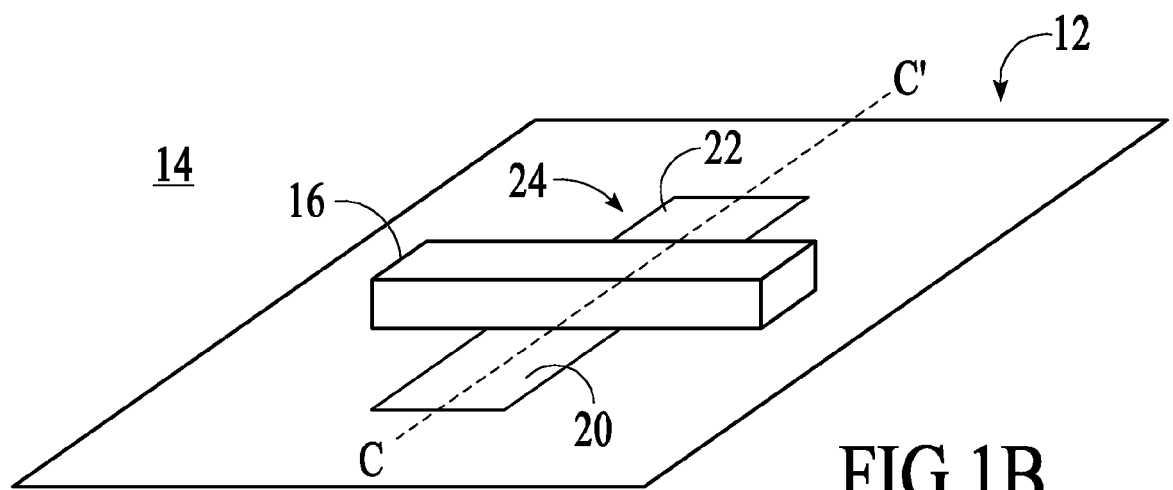
FIG. 1B is a three dimensional view of a prior art memory cell comprised of one electrically floating body transistor (PD-SOI NMOS)
Figure 1C:
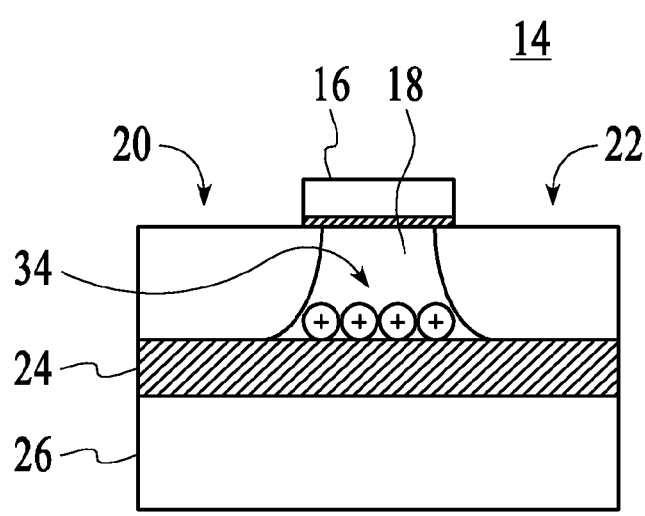
FIG. 1C is a cross-sectional view of the prior art memory cell of FIG. 1B, cross-sectioned along line C-C'.
Figure 2A:
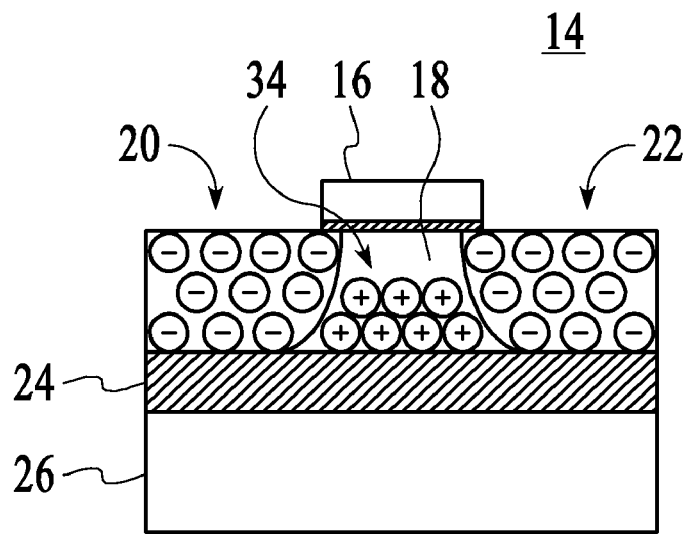
FIGS. 2A and 2B are example schematic illustrations of the charge relationship, for a given data state, of the floating body, source and drain regions of a prior art memory cell comprised of one electrically floating body transistor (PD-SOI NMOS)
Figure 2B:
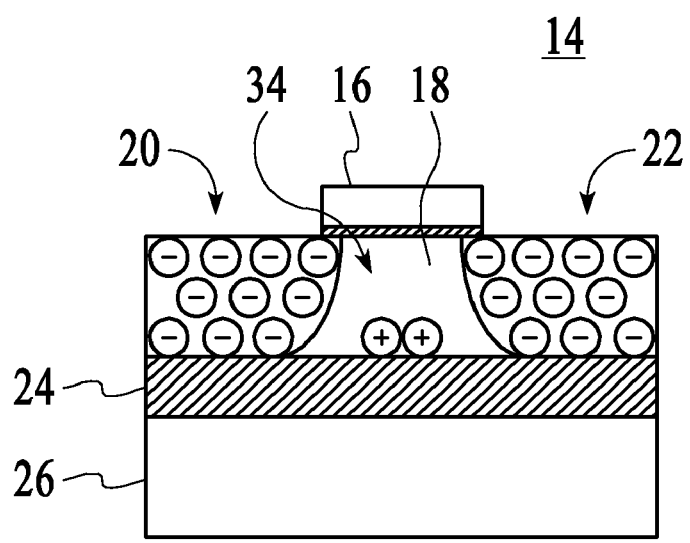
Figure 3A:
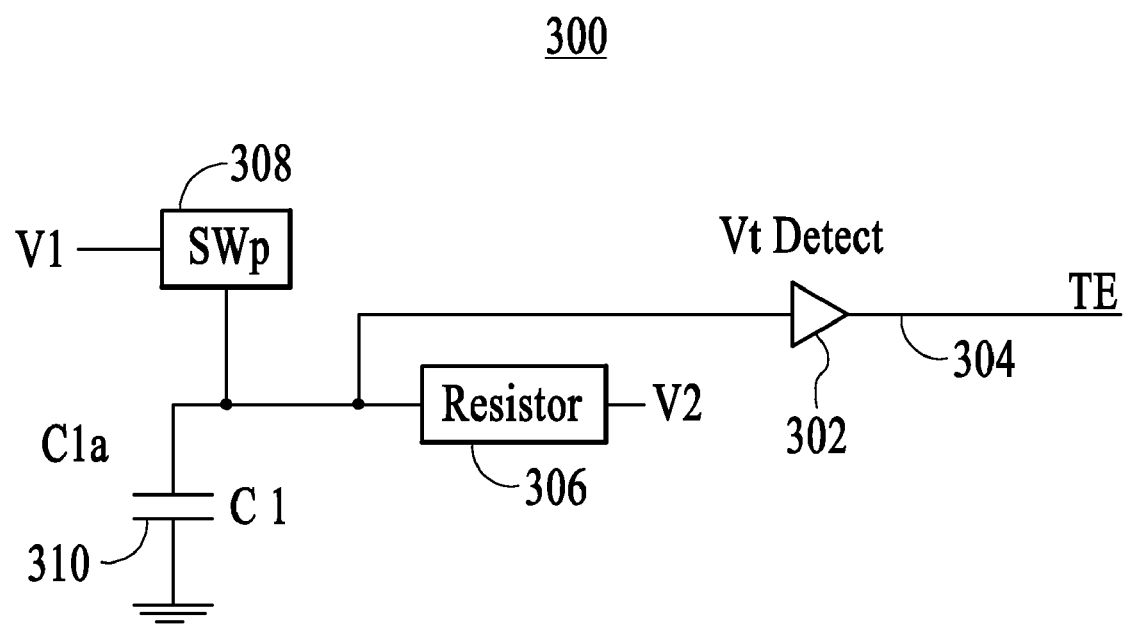
FIG. 3A is a schematic diagram of a prior art circuit for generating a refresh signal.
Figure 3B:
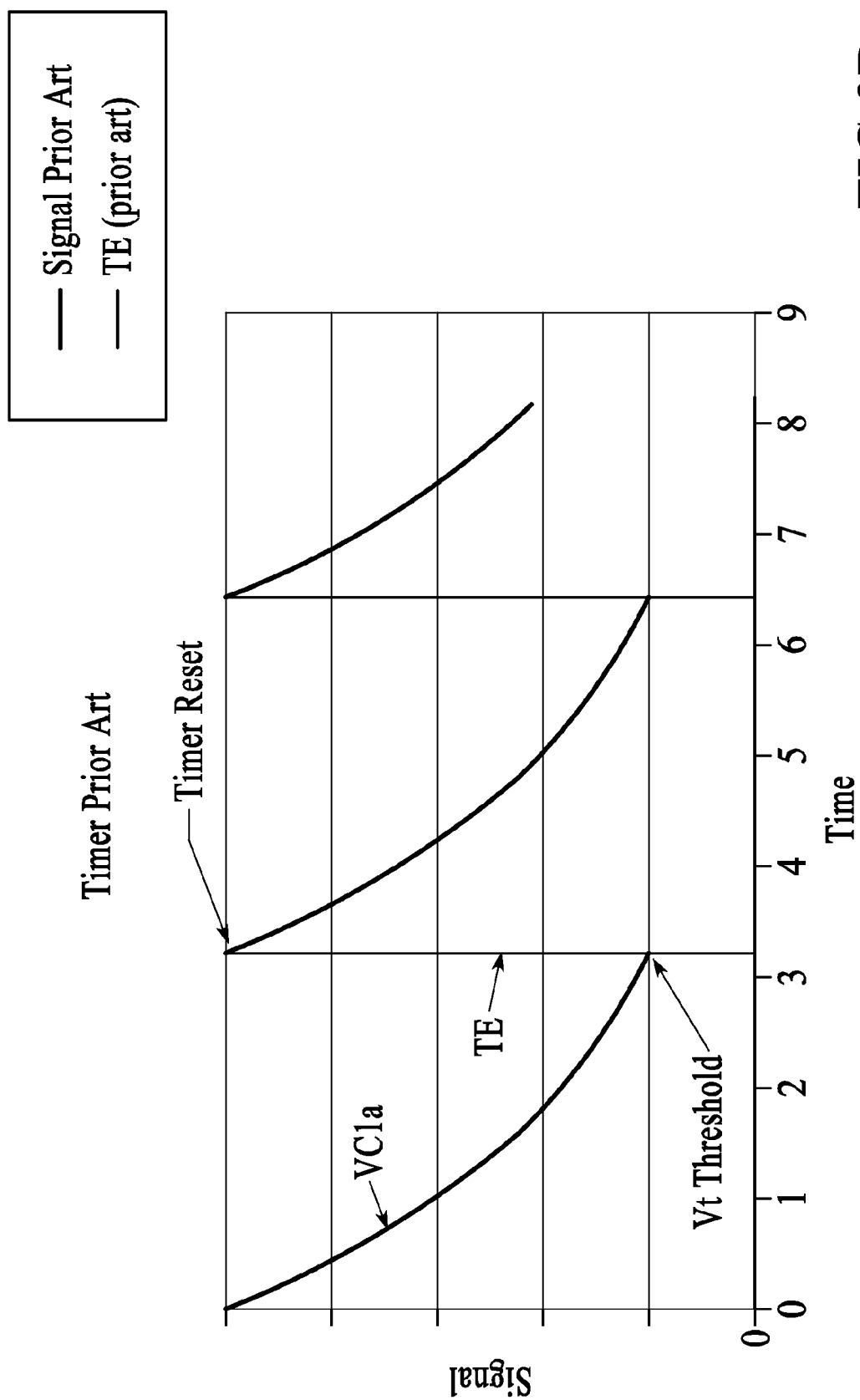
FIG. 3B is a timing diagram illustrating the occurrence of refresh operations at fixed intervals according to the circuit of FIG. 3A.

Refresh timer element 404 is an analog timer that generates a timer expired (TE) signal after the expiration of an interval that is fixed by the time it takes a potential stored on a capacitor C1 420 to decay to a predetermined level. Refresh timer 404 includes a switch SWp 418 connected to a voltage V1, which is typically a power supply voltage. Capacitor C1 420 is charged by voltage V1 through switch SWp 418. The capacitor C1 420 is connected through a node C1a to a resistor 416, switch SWp 418, and the input of a logic gate Vt detect 414. Capacitor C1 420 is further selectively coupled to event signal generator 402 at node C1a through a resistor R1 411 and a coupling switch SWc 412. When refresh timer element 404 is not coupled to event signal generator 402, refresh timer element 404 behaves in a substantially similar manner to the circuit of FIG. 3A. That is, when the potential on C1 420 decays to Vt, the logic gate 414 outputs the TE signal. Logic gate 414 can be an inverter, for example. The TE signal initiates a refresh operation on a memory cell or group of memory cells. The interval between refresh operations, provided that refresh timer element 404 is not coupled to event signal generator 402, is determined by the design of the refresh timer 404. In an embodiment, capacitor C1 420 is designed to model the data retention characteristics of a memory cell.

Event signal generator 402 includes an event detector element 406. Event signal generator 402 further includes a timer acceleration element 403 that includes an event switch, SWe 408, coupling switch SWc 412, resistor R1 411, and a capacitor C2 410. As further described below, in various embodiments, event detector element 406 detects one or more events, each of which typically reduce the data retention time of memory cells. Detected events in an embodiment include various memory access events such as Read operations and Write operations. Detected events in various embodiments further include temperature excursions outside some predetermined range, voltage excursions outside some predetermined range, and radiation excursions outside some predetermined range. The events specified here are just some examples of events that can be detected according to the claimed invention. In general, any event that can be detected and has an effect on data retention time of a memory cell can be used to generate an event signal 407. Event switch SWe 408 and coupling switch SWc 412 are each coupled to the event signal 407. When Event switch SWe 408 is on (conducting), coupling switch SWc 412 is off (non conducting). Conversely when Event switch SWe 408 is off (non-conducting), coupling switch SWc 412 is on (conducting). In an embodiment, event signal 407 is a single pulse which turns SWc 412 on, coupling refresh timer element 404 and event signal generator 402. At the same time, event signal 407 temporarily turns SWe 408 off.

When SWc 412 is on, C1 420 and C2 410 are temporarily connected through resistor R1 411 and charge sharing occurs between them. In an embodiment, C2 410 is smaller than C1 420, and charge sharing involves charge being taken from C1

420 and deposited on C2 410. This has the effect of accelerating the decay of potential on C1 420 and causing the refresh interval to be shortened. After the event, the voltage on C1a is:

$$V_{C1a(after)} = (V_{C1a(before)} * C1 + V_{c2a} * C2)/(C1+C2) \quad \text{eq. 1}$$

The change in voltage is:

$$\text{Change in voltage} = (V_{C1a(before)} - V_{c2a}) * C2/(C1+C2) \quad \text{eq. 2}$$

In a case where Vc2a=0 this becomes:

$$V_{C1a(after)} = (V_{C1a(before)} * C1)/(C1+C2) \quad \text{eq. 3}$$

$$\text{Change in voltage} = (V_{C1a(before)}) * C2/(C1+C2) \quad \text{eq. 4}$$

Equation 4 shows that the disturb amount created by a detected event is proportional to the remaining signal which tracks the impact of most disturb event mechanisms on stored charge more accurately than prior methods.

Depending on the values of R1 411, C1a, and C2a, the amount of time SWc 412 is on can be used to limit the amount of charge shared between nodes C1a and C2a.

When the event signal 407 is no longer active, SWc 412 is off and C1 420 and C2 410 are no longer connected together. In addition, SWe 408 is on which causes C2 410 to be precharged in preparation for the next event.

Figure 4D:
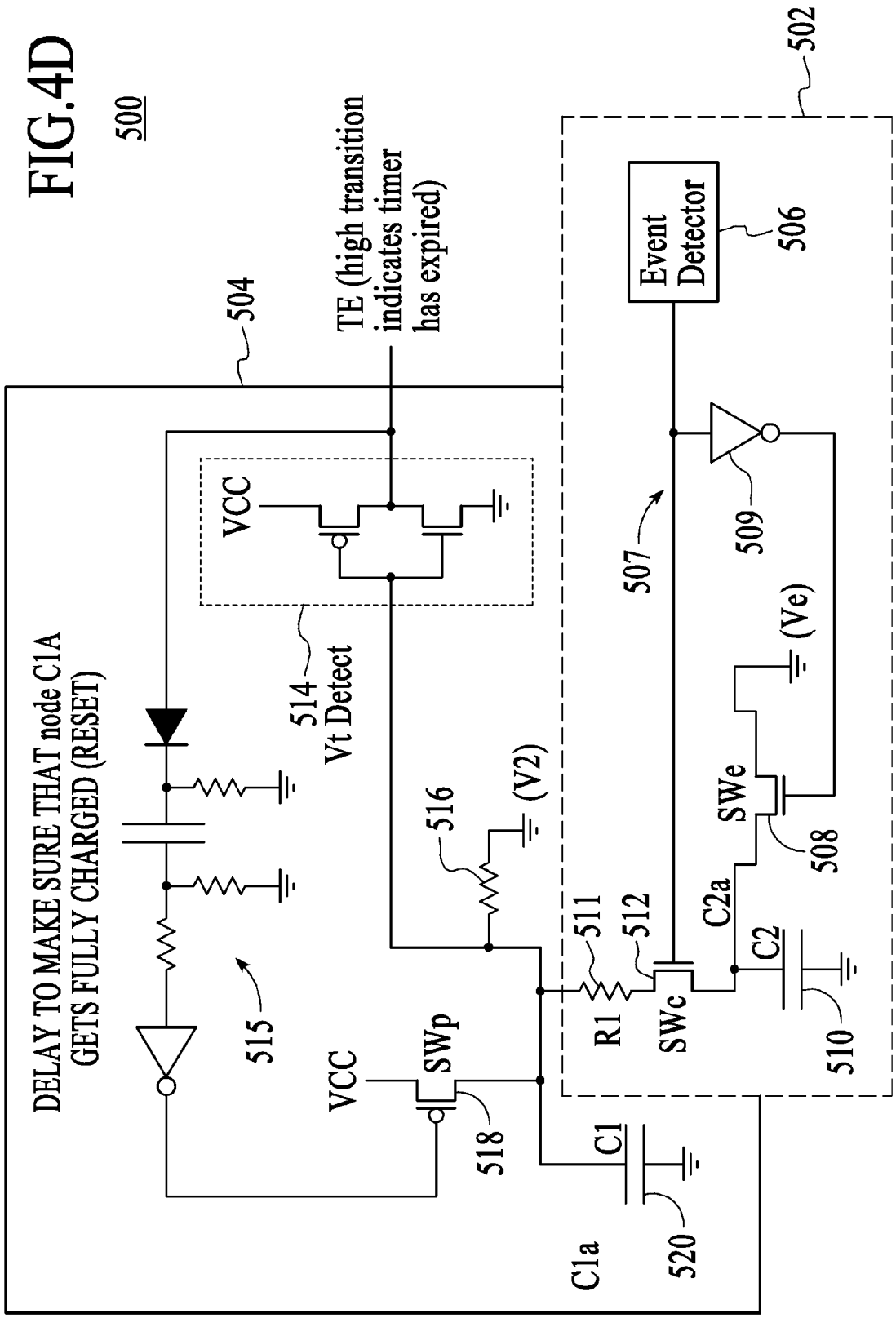
FIG. 4D is a schematic diagram of a variable memory refresh signal generation circuit, according to an embodiment.

The particular circuit designs of FIGS. 4A and 4D are just examples of an embodiment of the claimed invention. Many variations within the scope of the claims are possible and contemplated. For example, the polarities shown are one possible configuration in which the potential of the capacitors decays toward a predetermined voltage. The opposite is equally applicable. A logic gate is used to detect a threshold voltage Vt, but other mechanisms for generating a TE signal are also possible.

The values of circuit components are variable as appropriate to a particular implementation. For example, in one embodiment it is established that disturb events will be detected, and that in a worst case 100 disturbs can be experienced before a refresh operation should take place. For such a scenario, C2 410 can be approximately 1/100 the size of C1 420. Each disturb event, according to this design of circuit 400, removes 1/100$^{th}$ of the charge of C1 420, thus accelerating the decay of C1 420.

In another embodiment, one disturb is sufficient to warrant a refresh operation. In this scenario, C2 410 may be considerably larger than C1 420. In yet another embodiment, two disturbs are sufficient to warrant a refresh operation. In this scenario, C2 410 may be equal to C1 420, while Ve is at ground potential. Although typically it is desirable to keep track of hundreds of events, rather than one or two, many variations are possible within the scope of the claimed invention.

In summary, a memory sub-array that is not being accessed would behave similarly to conventional memory sub-arrays, while a sub-array receiving many disturb events would be refreshed more frequently.

FIG. 4C is a flow diagram of a method 407 for initiating a refresh operation on one or more memory cells, according to an embodiment. At 432, an initial refresh timer potential is stored in the refresh timer element 404. In an embodiment, storing the initial refresh timer potential includes coupling node C1a of capacitor C1 420 to voltage V1. As shown at 434, the output of the event detector element 406 is continually monitored. If an event is detected, the remaining refresh timer potential (at C1a) is coupled to the event potential at 436, and the decay of the refresh timer potential is accelerated, as referenced by the "Timer Disturb" arrow.

Referring next to 438, the refresh potential is continually monitored. If the refresh potential has decayed to a level below or equal to the trigger threshold Vt, a timer expired (TE) signal is output at 440. Following output of the TE signal, the initial refresh timer potential is stored in the refresh timer element at 432 (as referenced by the "Reset Timer" arrow), and the process begins again. In addition, the TE signal initiates a refresh of the memory cells being monitored.

FIG. 4D is a schematic diagram of a variable memory refresh signal generation circuit 500, according to the embodiment shown in FIG. 4B. Circuit 500 operates in a similar manner to circuit 400, while further details of some elements are shown in circuit 500. Circuit 500 includes a refresh timer element 504 and an event signal generator 502. Refresh timer element 504 operates to generate a timer expired (TE) signal that initiates a refresh operation to one or more memory cells. Event signal generator 502 detects events that may reduce the data retention time of one or more memory cells. When an event is detected, event signal generator 502 is coupled to refresh timer element 504 such that a refresh interval (which is determined by the design of refresh timer element 504) is shortened.

Refresh timer element 504 is an analog timer that generates a timer expired (TE) signal after the expiration of an interval that is fixed by the time it takes a potential stored on a capacitor C1 520 to decay to a predetermined level Vt. Refresh timer 504 includes a switch SWp 518 connected, in one embodiment, to a power supply voltage Vcc. Capacitor C1 520 is charged by voltage Vcc through switch SWp 518. The capacitor C1 520 is connected through a node C1a to a resistor 516, switch SWp 518, and the input of a logic gate Vt detect 514. Capacitor C1 520 is further selectively coupled to event signal generator 502 at node C1a through a resistor R1 511, and coupling switch SWc 512. When refresh timer element 504 is not coupled to event signal generator 502, refresh timer element 504 behaves in a substantially similar manner to the circuit of FIG. 3A. That is, when the potential on C1 520 decays to Vt, the logic gate 514 outputs the TE signal. Logic gate 514 can be an inverter, for example. The TE signal initiates a refresh operation on a memory cell or group of memory cells. The interval between refresh operations, provided that refresh timer element 504 is not coupled to event signal generator 502, is determined by the design of the refresh timer 504. In an embodiment, capacitor C1 520 is designed to model the data retention characteristics of a memory cell. Refresh timer 504 includes a delay 515 that assures enough time to fully charge, or reset, node C1a after capacitor C1 520 and node C1a have discharged. Delay 515 includes a diode and a capacitor and resistor arrangement as shown. Delay 515 further includes an inverter that outputs a signal to SWp 518, the switch that couples C1 520 to Vcc for charging.

Event signal generator 502 includes an event detector element 506. Event signal generator 502 further includes a timer acceleration element that includes an event switch SWe 508, coupling switch SWc 512, a capacitor C2 510, and resistor R1 511. As further described below, in various embodiments, event detector element 506 detects one or more events, each of which typically reduce the data retention time of memory cells. Detected events in an embodiment include various memory access events such as Read operations and Write operations. Detected events in various embodiments further include temperature excursions outside some predetermined range, voltage excursions outside some predetermined range, and radiation excursions outside some predetermined range. The events specified here are just some examples of events that can be detected according to the claimed invention. In general, any event that can be detected and has an affect on data retention time of a memory cell can be used to generate an event signal 507. Event switch SWe 508 and coupling switch SWc 512 are each coupled to the event signal 507. When Event switch SWe 508 is on (conducting), coupling switch SWc 512 is off (non conducting). Conversely when Event Switch SWe 508 is off (non-conducting), coupling switch SWc is on (conducting). In an embodiment, event signal 507 is a single pulse which turns SWc 512 on, coupling refresh timer element 504 and event signal generator 502 through resistor R1 511. At the same time, event signal 507 temporarily turns SWe 508 off. When SWc 512 is on, C1 520 and C2 510 are temporarily connected through resistor R1 511 and charge sharing occurs between them. In an embodiment, C2 510 is smaller than C1 520, and charge sharing involves charge being taken from C1 520 and deposited on C2 510. This has the effect of accelerating the decay of potential on C1 520 and causing the refresh interval to be shortened.

When the event signal 507 is no longer active, SWc 512 is off and C1 520 and C2 510 are no longer connected. In addition, SWe 508 is on which causes $C_{2-510}$ to be precharged in preparation for the next event.

The specific components and their arrangements in FIGS. 4 and 5 are examples of particular embodiments only, and are not intended to be limiting. Many variations within the cope of the claimed inventions are possible. For example, FIGS. 4 and 5 illustrate an analog solution to more efficiently control refresh intervals, reduce refresh overhead, and integrate a refresh timer with event-driven refresh initiation. In other embodiments, various parts of the circuits shown could be replaced by digital logic. In general, however, digital logic is minimized to produce an efficient solution for most applications. In yet other embodiments, detected events are "enhancing events" that lengthen the data retention time of a cell. In this case the timer circuit is configured accordingly, for example with Ve equal to V1 (e.g. Vcc), or at a potential above Vt.

Figure 5A:
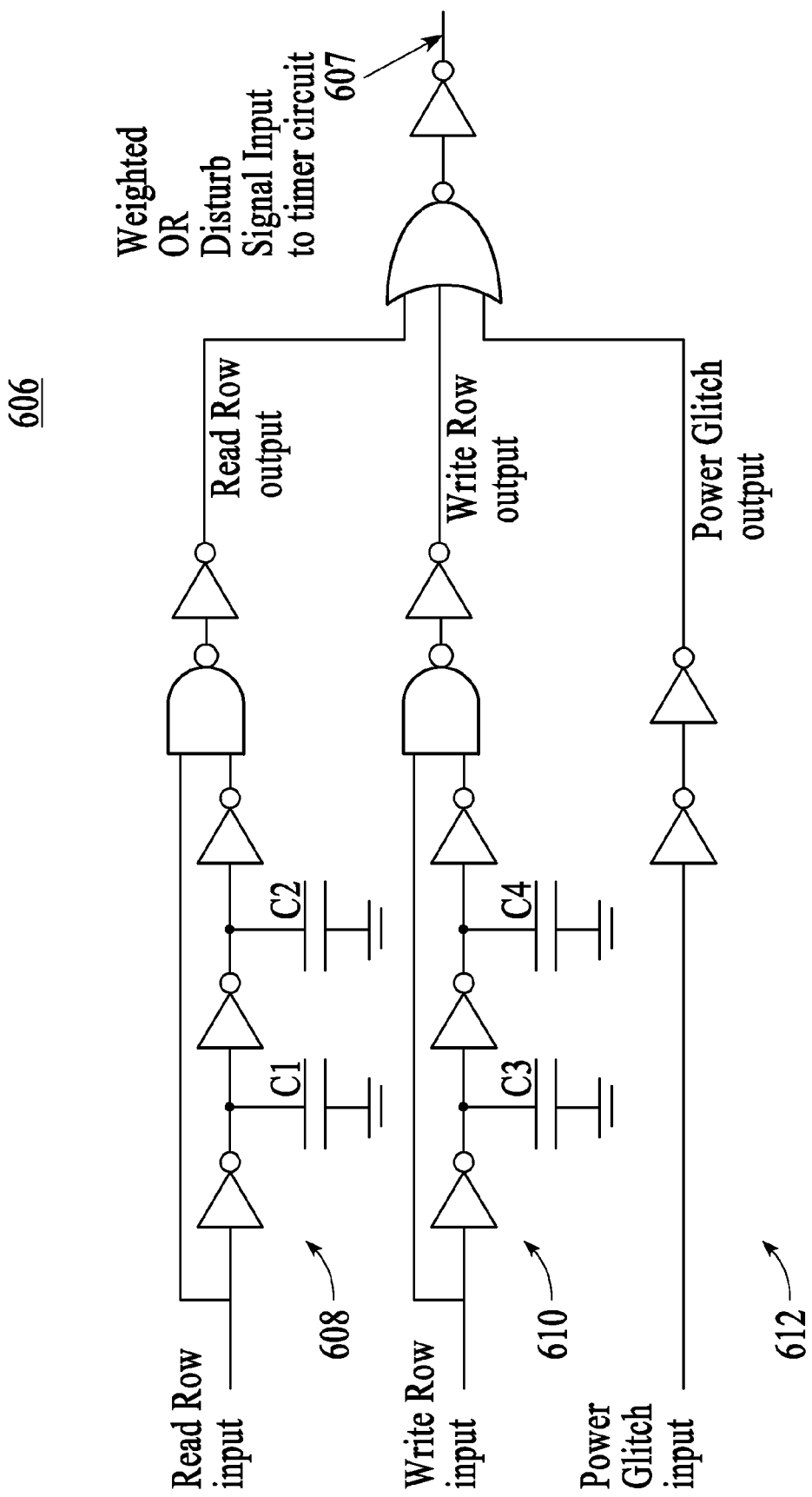
FIG. 5A is a schematic diagram of an event detector, according to an embodiment.

FIG. 5A is a schematic diagram of a disturb summing circuit 606. Disturb summing circuit 606 is one embodiment of an event detector element (such as 406 or 506), but the invention is not so limited. Disturb summing circuit 606 detects disturb events including a Read row event, a Write row event, and a Power glitch event.

In an embodiment, disturb summing circuit 606 is a summing circuit that includes a Read row event detect circuit 608, a Write row event detect circuit 610, and a Power glitch event detect circuit 612. Each of circuits 608 and 610 includes two capacitors. Each of the capacitors is coupled between ground and a node that is an input node for one inverter and an output node for another inverter. Circuit 608 includes capacitors C1 and C2. Circuit 610 includes capacitors C3 and C4. Each of capacitors C1-C4 can have different values to weight a Read row output signal and a Write row output signal.

A Read row input is coupled to circuit 608 and to an input of a Read row NAND gate. The output of circuit 608 is coupled to another input of the Read row NAND gate. The output of the Read row NAND gate is inverted to become the Read row output.

A Write row input is coupled to circuit 610 and to an input of a NAND gate. The output of circuit 610 is coupled to another input of the Write row NAND gate. The output of the Write row NAND gate is inverted to become the Write row output.

Circuit 612 includes two inverters in series. A Power glitch input is coupled to the circuit 612. Circuit 612 outputs a Power glitch output. The Read row output, the Write row output, and the Power glitch output are each inputs to a NOR gate whose output is inverted to become a weighted OR disturb signal, which is input to the timer circuit described in various embodiments herein.

Figure 5B:
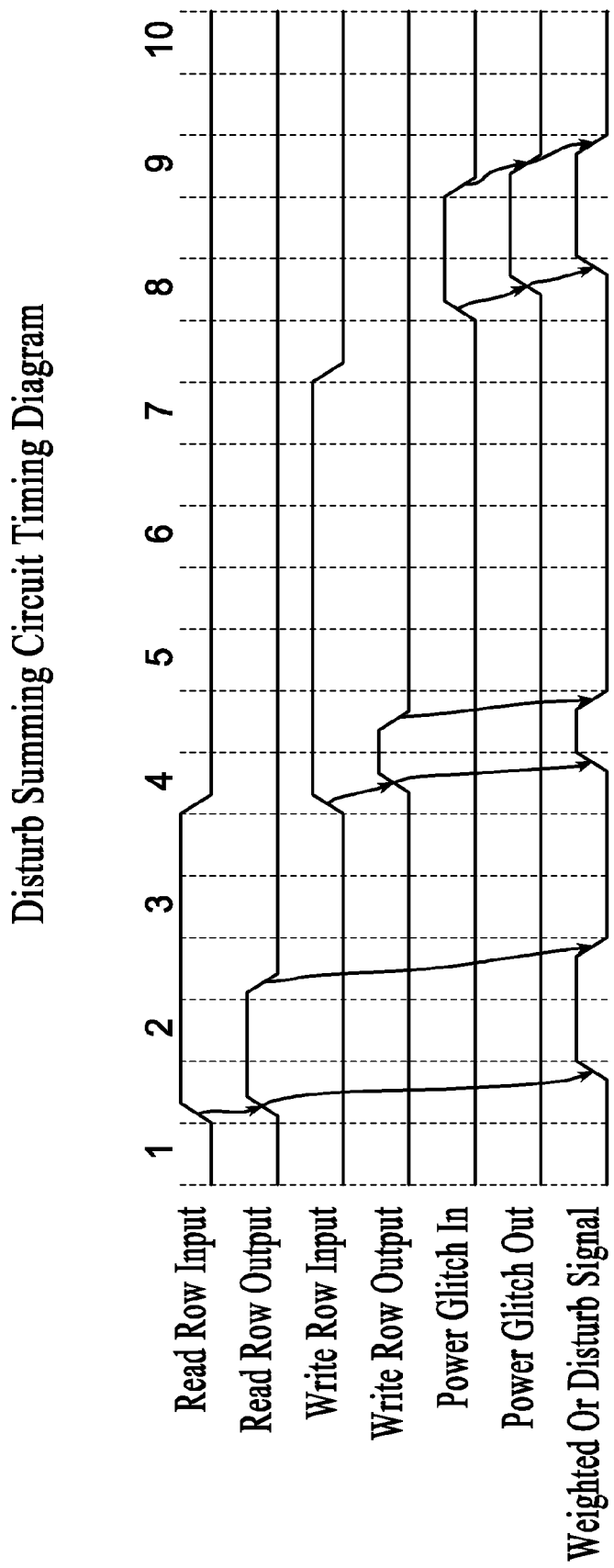
FIG. 5B is a timing diagram for the event detector of FIG. 5A, according to an embodiment.

FIG. 5B is a timing diagram illustrating the operation of the disturb summing circuit of FIG. 5A in an embodiment. Timing of the Read row output is controlled by the values of C1 and C2, and the strength of the inverters in circuit 608. This configuration functions in modes according to which the Read row input pulse is greater than the RC delay attributable to the three inverters of circuit 608. The Write row output is similarly controlled by the values of C3 and C4, and the strength of the inverters in circuit 610.

Relative to the Read row leg, the ratio between capacitor size and inverter strength is lower, and thus, a Write row access generates a shorter disturb pulse. This relative difference illustrates that the width of the disturb pulse can be controlled by embodiments for different events. The Power glitch output time is controlled by the length of the power glitch.

The length of the disturb signal pulse 607 from circuit 606 determines how long the refresh timer element (e.g. 504) is coupled to the event signal generator (e.g. 502) through resistor R1. Since the rate of charge transfer between C1a and C2a is limited by resistor R1 the width of the disturb pulse controls the total amount of charge transferred.

Figure 6:
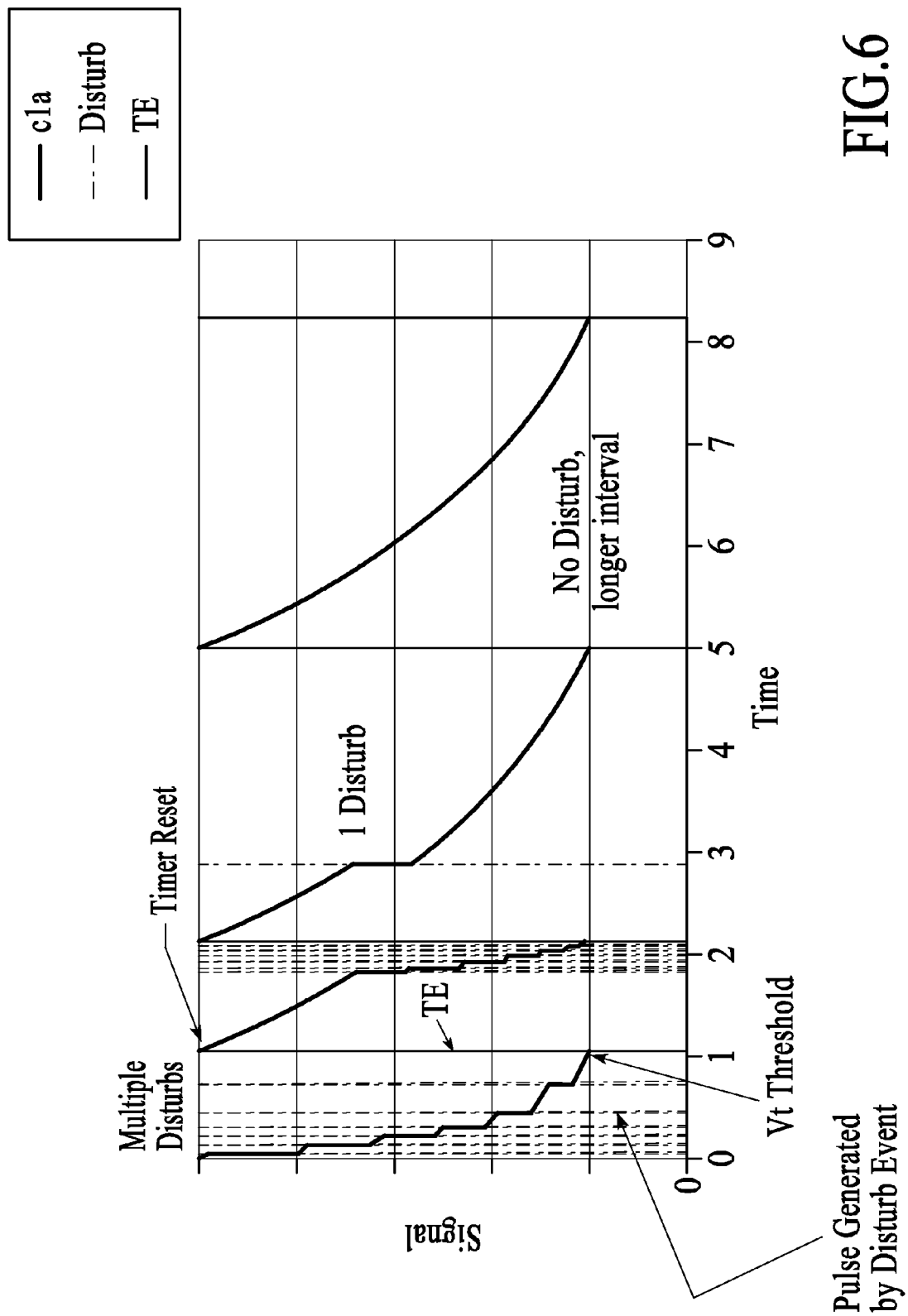
FIG. 6 is a timing diagram illustrating the occurrence of refresh operations at variable intervals according to the circuit of FIG. 4B or the circuit of FIG. 4D.

FIG. 6 is a timing diagram illustrating the occurrence of refresh operations at variable intervals according to the circuit of FIG. 4A or the circuit of FIG. 4D. A signal level (in arbitrary units) is shown on the vertical axis, and time (in arbitrary units) is shown on the horizontal axis. A threshold voltage, Vt, is marked as the first delineation of the vertical signal axis. Looking from the left to the right on the diagram, a potential level of C1 (the potential at node C1a) is shown decaying from an initial high level until it reaches Vt. The timer expired signal TE is fired when the voltage at C1a reaches Vt. Also, the refresh timer is reset when the voltage at C1a reaches Vt. This involves recharging capacitor C1 through switch SWp (e.g. 418 or 518).

Pulses (such as signals 607, 407 and 507) generated by disturb events are shown as narrow vertical lines. To the right of each pulse, the decay of the potential at C1a is accelerated, as shown by the steepening of the curve after each pulse. It can be seen in FIG. 6 that the interval between refresh operations (which correspond to the timer reset events shown in the timing diagram) is variable. Referring to the interval between time 0 and the first timer reset, for example, a relatively large number of disturbs occur, as shown by the number of pulses. A similar number of pulses occur in the succeeding interval, which is approximately the same length as the first interval. In the third interval (approximately between time 2.2 and time 5), however, only one pulse occurs. The third interval is thus significantly longer (approximately three time as long) as the first two intervals. Thus, significant power savings are realized when few disturb events occur and unnecessary refresh operations are avoided, according to embodiments described herein.

Figure 7:
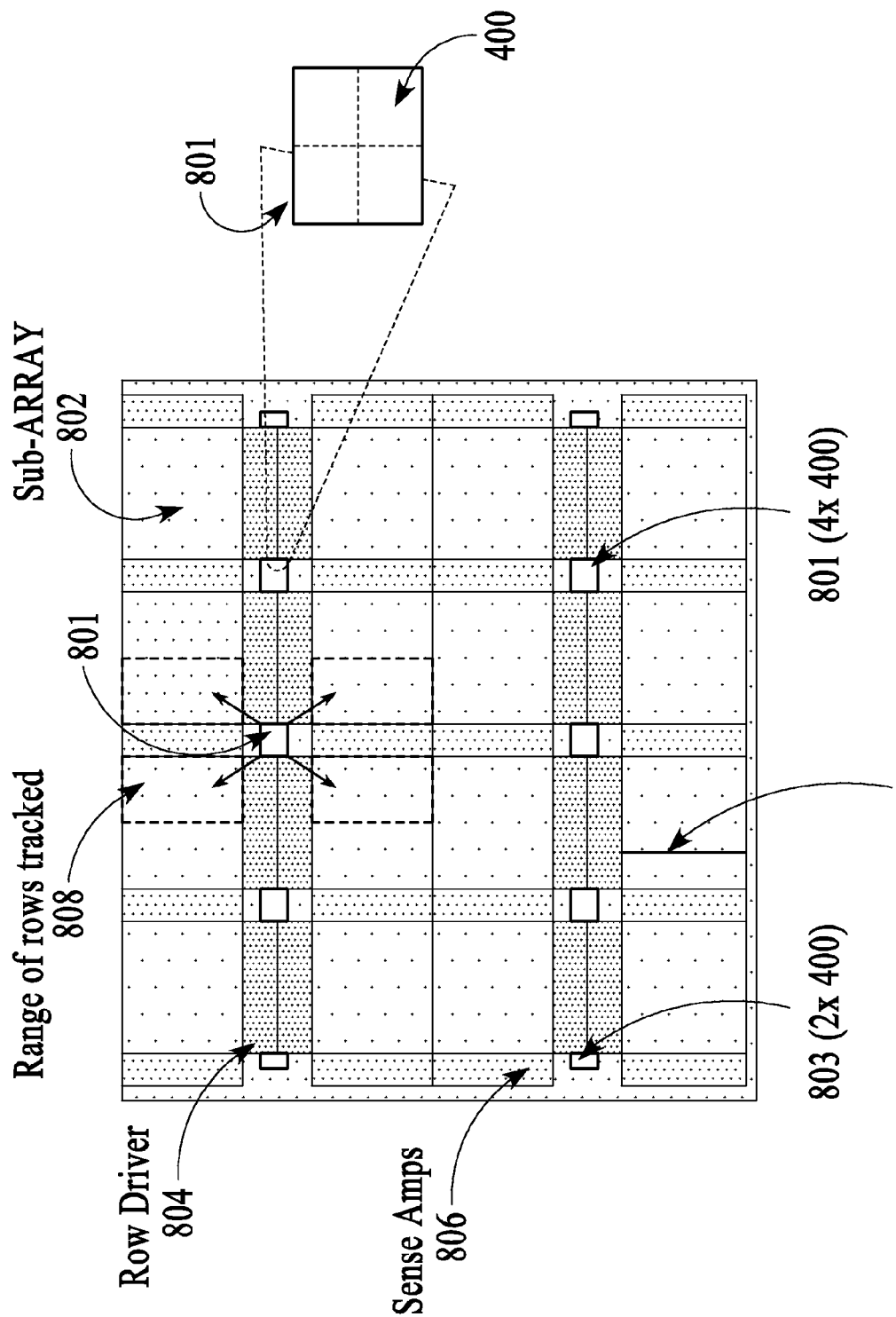
FIG. 7 is a block diagram of a memory array incorporating variable memory refresh signal generation circuits, according to an embodiment.

FIG. 7 is a block diagram of a memory array 800 incorporating variable memory refresh signal generation circuits, according to an embodiment. In an embodiment, the memory array 800 includes multiple circuits 400, each of which monitors events for a designated group of memory cells and initiates a refresh operation on the designated group of memory cells.

Memory array 800 is just one specific example of an embodiment that includes 32 instances of circuit 400. Each of the circuit 400 instances monitors events for, and initiates a refresh operation on, one half of a sub-array. Sub-array 802 is one example of a sub-array. Half-sub-array 808 is an example of one half of a sub-array. Adjacent to half-sub-array 808 is a group 801 of circuits 400. Each group 801 includes four circuits 400, as shown in the break-out on the right of the figure. Each of the four circuits 400 in a group 801 monitors one half-sub-array as indicated by the arrows joining 801 with half-sub-arrays on the array 800. This example further includes groups 803, each including two circuits 400. Groups 803 monitor half-sub-arrays on the right and left edges of the memory array 800 as shown.

Memory array 800 further includes row drivers, such as row driver 804, and sense amplifiers (sense amps) such as sense amps 806. An example row is referenced by 810. Processes such as Read and Write operations to array 800 can also partially disturb the content of addressed cells or partially addressed cells.

Memory array 800 is one example of on-chip circuits 400. As previously stated, one or more circuits 400 can also be located off-chip. In addition, on-chip configurations are possible. For example, other embodiments include one circuit 400 per row 810. This is an embodiment that offers very fine grain control of the refresh process and may provide optimum power savings, but requires more circuitry than the example of memory array 800. Another embodiment includes one circuit 400 for an entire memory array. This is an embodiment that offers very coarse grain control of the refresh process and may not provide optimum power savings, but requires very little circuitry.

Figure 8A:
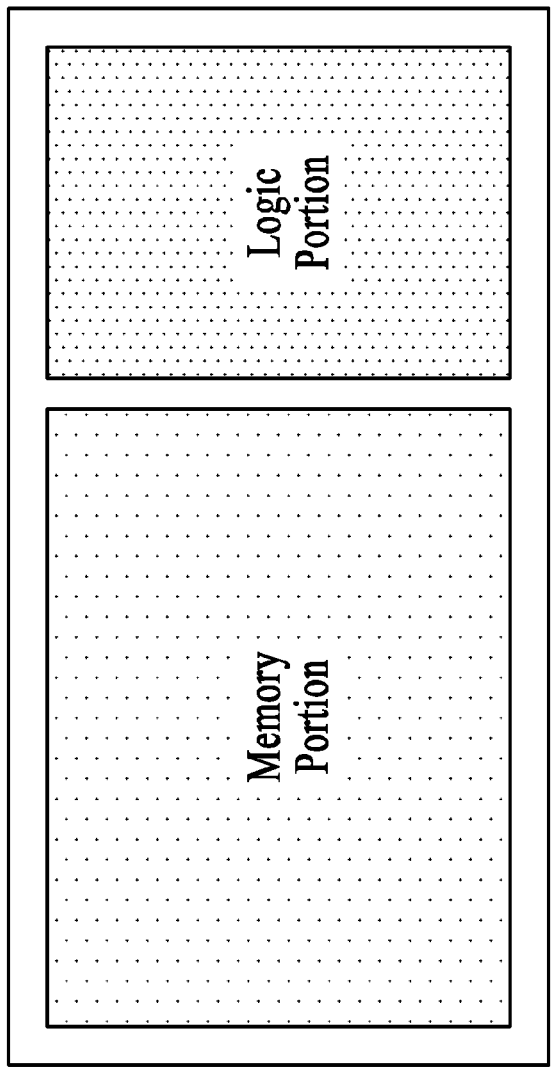
Figure 8B:
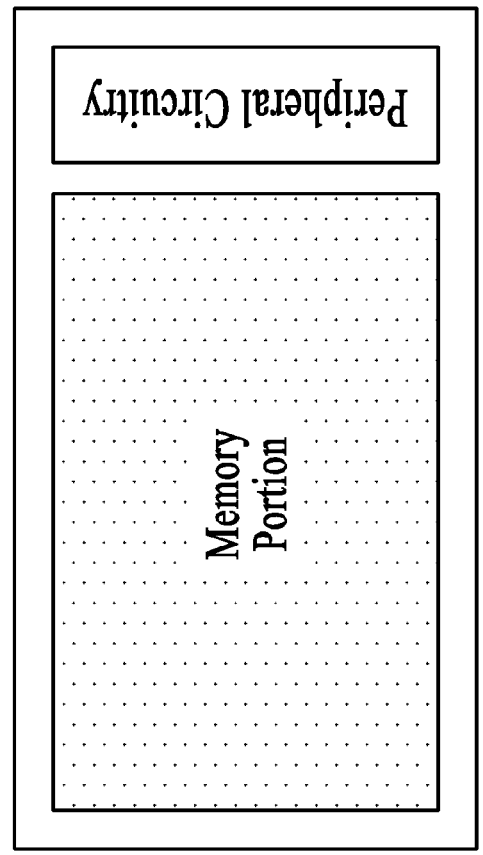

FIGS. 8A and 8B are block diagram illustrations of example devices in which the present embodiments may be implemented wherein FIG. 8A is a logic device (having logic circuitry and resident memory) and FIG. 8B is a memory device (including primarily one or more memory arrays and peripheral circuitry), according to certain aspects of the present embodiments. Variable memory refresh signal generation circuits, or parts thereof, as disclosed herein can be located on the memory (as in the example of FIG. 7). Alternatively, variable memory refresh signal generation circuits, or parts thereof, as disclosed herein, can be part of the logic portion of FIG. 8A, and/or the peripheral circuitry of FIG. 8B. Further, any combination of these arrangements is also possible, such as variable memory refresh signal generation circuits, or parts thereof, being located both on the memory portion and on the logic portion and/or the peripheral circuitry.

Notably, the present inventions may be implemented in conjunction with any memory cell technology, whether now known or later developed. For example, the memory cells may include one or more electrically floating body transistors, one transistor-one capacitor architecture, electrically floating gate transistors, junction field effect transistors (often referred to as JFETs), or any other memory/transistor technology whether now known or later developed. All such memory technologies are intended to fall within the scope of the present inventions.

Further, the present inventions may be implemented in conjunction with any type of memory (including discrete or integrated with logic devices), whether now known or later developed. For example, the memory may be a DRAM, SRAM and/or Flash. All such memories are intended to fall within the scope of the present inventions.

In one embodiment, the memory cells of the memory cell array may include at least one electrically floating body transistor which stores an electrical charge in the electrically floating body region of the transistor. One type of such memory cell is based on, among other things, a floating body effect of semiconductor on insulator (SOI) transistors. (See, for example, (1) Fazan et al., U.S. Pat. No. 6,969,662, (2) Okhonin, "Semiconductor Memory Cell and Array using Bipolar Transistor Currents to Program and Read Same", Application Ser. No. 60/749,385, filed Dec. 12, 2005, and (3) Okhonin, "Floating Body Memory Cell and Array, and Method of Operating or Controlling Same", Application Ser. No. 60/751,505, filed Dec. 19, 2005, which are all incorporated by reference herein in their entirety). In this regard, the memory cell may consist of a PD or a FD SOI transistor (or transistor formed on or in bulk material/substrate) having a gate, which is disposed adjacent to the electrically floating body and separated therefrom by a gate dielectric. The body region of the transistor is electrically floating in view of the insulation or non-conductive region (for example, in bulk-type material/substrate) disposed beneath the body region. The state of memory cell is determined by the concentration of charge within the body region of the SOI transistor.

As mentioned above, the memory cells of the memory cell array may be comprised of N-channel, P-channel and/or both types of transistors. Indeed, circuitry that is peripheral to the memory array (for example, sense amplifiers or comparators, row and column address decoders, as well as line drivers (not illustrated in detail herein)) may include P-channel and/or N-channel type transistors. Where N-channel type transistors or P-channel type transistors are employed as the memory cells in the memory array(s), suitable write and read voltages are well known to those skilled in the art (and in view of the U.S. patents and U.S. patent applications incorporated herein by reference).

Moreover, the present inventions may be implemented in conjunction with any memory cell array configuration and/or arrangement of memory cell array, such as the example memory array of FIG. 7. In this regard, the integrated circuit device (for example, memory or logic device) may include a plurality of memory cell arrays, each having a plurality of memory cells. In addition, the present inventions may be employed or implemented in conjunction with one or more of the inventions, memory cells, memory arrays, and techniques for programming, reading, controlling and/or operating a memory cell and array of the following provisional U.S. patent applications:

(1) U.S. Non-Provisional patent application Ser. No. 11/304,387, which was filed by Okhonin et al. on Dec. 15, 2005 and entitled "Bipolar Reading Technique for a Memory Cell Having an Electrically Floating Body Transistor" (U.S. patent application Publication No. 2006/0131650);

(2) U.S. Non-Provisional patent application Ser. No. 11/453,594, which was filed by Okhonin et al. on Jun. 15, 2006 and entitled "Method for Reading a Memory Cell Having an Electrically Floating Body Transistor, and Memory Cell and Array Implementing Same";

(3) U.S. Non-Provisional patent application Ser. No. 11/509,188, which was filed by Okhonin et al. on Aug. 24, 2006, and entitled "Memory Cell and Memory Cell Array Having an Electrically Floating Body Transistor, and Methods of Operating Same";

(4) U.S. Non-Provisional patent application Ser. No. 11/515,667, which was filed by Bauser on Sep. 5, 2006, and entitled "Method and Circuitry to Generate a Reference Current for Reading a Memory Cell, and Device Implementing Same"; and (5) U.S. Non-Provisional patent application Ser. No. 11/633,311, which was filed by Okhonin on Dec. 4, 2006, and entitled "Electrically Floating Body Memory Cell and Array, and Method of Operating or Controlling Same".

The entire contents of these five (5) U.S. patent applications, including, for example, the inventions, features, attributes, architectures, configurations, materials, techniques and advantages described and illustrated therein, are hereby incorporated by reference herein. For the sake of brevity, those discussions will not be repeated; rather those discussions (text and illustrations), including the discussions relating to the memory cell, architecture, layout, structure, are incorporated by reference herein in their entirety.

In addition, the memory cells may be arranged, configured and/or controlled using any of the memory cell arrays, architectures and/or control/operation techniques. For example, the memory cells may be arranged, configured and/or controlled using any of the memory cell arrays, architectures and/or control/operation techniques described and illustrated in the following provisional and non-provisional U.S. patent applications:

(1) application Ser. No. 10/450,238, which was filed by Fazan et al. on Jun. 10, 2003, and entitled "Semiconductor Device" (now U.S. Pat. No. 6,969,662);

(2) application Ser. No. 10/487,157, which was filed by Fazan et al. on Feb. 18, 2004, and entitled "Semiconductor Device" (now U.S. Pat. No. 7,061,050);

(3) application Ser. No. 10/829,877, which was filed by Ferrant et al. on Apr. 22, 2004, and entitled "Semiconductor Memory Cell, Array, Architecture and Device, and Method of Operating Same" (U.S. patent application Publication No. 2005/0013163);

(4) U.S. Non-Provisional patent application Ser. No. 11/096,970, which was filed by Ferrant et al. and entitled "Semiconductor Memory Device and Method of Operating Same" (now U.S. Pat. No. 7,085,156); and (5) application Ser. No. 10/941,692, which was filed by Fazan et al. on Sep. 15, 2004, and entitled "Low Power Programming Technique for a One Transistor SOI Memory Device & Asymmetrical Electrically Floating Body Memory Device, and Method of Manufacturing Same" (U.S. patent application Publication No. 2005/0063224).

The entire contents of these five (5) U.S. patent applications, including, for example, the inventions, features, attributes, architectures, configurations, materials, techniques and advantages described and illustrated therein, are hereby incorporated by reference herein. For the sake of brevity, those discussions will not be repeated; rather those discussions (text and illustrations), including the discussions relating to the memory cell, architecture, layout, structure, are incorporated by reference.

Notably, the present inventions may be fabricated using well known techniques and/or materials. Indeed, any fabrication technique and/or material, whether now known or later developed, may be employed to fabricate the electrically floating memory cells, transistors and/or memory array(s). For example, the present inventions may employ silicon, germanium, silicon/germanium, gallium arsenide or any other semiconductor material (whether bulk-type or SOI) in which transistors may be formed. Indeed, where the memory cells include one or more electrically floating transistors (for example, fabricated on or in SOI substrates), the memory cells, and/or memory array(s) may employ the techniques described and illustrated in non-provisional patent application entitled "Integrated Circuit Device, and Method of Fabricating Same", which was filed on Jul. 2, 2004, by Fazan, Ser. No. 10/884,481 (U.S. patent application Publication No. 2005/0017240), provisional patent application entitled "One Transistor Memory Cell having Mechanically Strained Electrically Floating Body Region, and Method of Operating Same", which was filed on Oct. 19, 2005, Ser. No. 60/728, 060, by Bassin, and/or provisional patent application entitled "Memory Cell, Array and Device, and Method of Operating Same", which was filed on Oct. 19, 2005, Ser. No. 60/728, 061, by Okhonin et al. (hereinafter collectively "Integrated Circuit Device Patent Applications"). The entire contents of the Integrated Circuit Device Patent Applications, including, for example, the inventions, features, attributes, architectures, configurations, materials, techniques and advantages described and illustrated therein, are hereby incorporated by reference herein.

Further, where the memory cells include one or more electrically floating transistors (for example, fabricated on or in SOI substrates), a memory array (including SOI memory transistors) may be integrated with SOI logic transistors, as described and illustrated in the Integrated Circuit Device Patent Applications. For example, in one embodiment, an integrated circuit device includes memory section (having, for example, PD or FD SOI memory transistors 14) and logic section (having, for example, high performance transistors, such as FinFET, multiple gate transistors, and/or non-high performance transistors (for example, single gate transistors that do not possess the performance characteristics of high performance transistors—not illustrated)). Again, the entire contents of the Integrated Circuit Device Patent Applications, including, for example, the inventions, features, attributes, architectures, configurations, materials, techniques and advantages described and illustrated therein, are hereby incorporated by reference.

There are many inventions described and illustrated herein. While certain embodiments, features, attributes and advantages of the inventions have been described and illustrated, it should be understood that many others, as well as different and/or similar embodiments, features, attributes and advantages of the present inventions, are apparent from the description and illustrations. As such, the embodiments, features, attributes and advantages of the inventions described and illustrated herein are not exhaustive and it should be understood that such other, similar, as well as different, embodiments, features, attributes and advantages of the present inventions are within the scope of the present inventions.

For example, the present inventions may be implemented in conjunction with memory cells of a memory array such as memory array 800 which implement any memory cell technology that generates at least two current or voltage values (each current or voltage being representative of, for example, a respective data state) and employs a reference signal to discriminate such data states. The reference signal may be a current, voltage and/or time or temporal value (i.e., wherein a data state is determined based on detecting a signal within a given or predetermined period of time (for example, a logic high when a signal is detected with the given or predetermined period of time and a logic low when the signal is not detected with the given or predetermined period of time)).

For example, memory cells in any embodiments may be comprised of electrically floating gate transistors, junction field effect transistors (often referred to as JFETs), or any other memory/transistor technology whether now known or later developed. All such memory technologies are considered to fall within the scope of the present inventions. Indeed, such memory cells may be employed in any of the embodiments described and/or illustrated herein. Indeed, all permutations and combinations of such memory cells with such embodiments and/or features thereof, are intended to fall within the scope of the present inventions. For the sake of brevity, such permutations and combinations are not discussed in detail herein.

Notably, where electrically floating body transistors (such as transistor 14) are employed, electrically floating body transistor 14 may be a symmetrical or non-symmetrical device.

Where transistor 14 is symmetrical, the source and drain regions are essentially interchangeable. However, where transistor 14 is a non-symmetrical device, the source or drain regions of transistor 14 have different electrical, physical, doping concentration and/or doping profile characteristics. As such, the source or drain regions of a non-symmetrical device are typically not interchangeable. This notwithstanding, the drain region of the electrically floating N-channel type transistor of the memory cell (whether the source and drain regions are interchangeable or not) is that region of the transistor that is connected to the bit line/sense amplifier.

As mentioned above, the embodiments described and illustrated herein are entirely applicable to N-channel and/or P-channel type transistors. Moreover, while the discussion describes and illustrates only source and drain implants, other implants may also be included. For example, implants to modify the operation of memory cells, which affect, for example, the power consumption of memory cells as described and illustrated in (1) Fazan et al., U.S. Pat. No. 6,969,662, entitled "Semiconductor Device", (2) Fazan et al., U.S. Pat. No. 7,061,050 entitled "Semiconductor Device"; and (3) Provisional Application Ser. No. 60/578,631, which was filed on Jun. 10, 2004, and entitled "Asymmetrical Electrically Floating Body Memory Device, and Method of Manufacturing Same".

Further, as mentioned above, the memory arrays may be comprised of N-channel type transistors, P-channel type transistors and/or both types of transistors, as well as partially depleted and/or fully depleted type transistors. For example, circuitry that is peripheral to the memory array (for example, sense amplifiers or comparators, row and column address decoders, as well as line drivers (not illustrated herein)) may include fully depleted type transistors (whether P-channel and/or N-channel type). Alternatively, such circuitry may include partially depleted type transistors (whether P-channel and/or N-channel type). There are many techniques to integrate both partially depleted and/or fully depleted type transistors on the same substrate (see, for example, U.S. Pat. No. 7,061,050). All such techniques, whether now known or later developed, are intended to fall within the scope of the present inventions.

The embodiments of the inventions described and illustrated above are merely provided as examples. The embodiments are not intended to be exhaustive or to limit the inventions to the precise forms, techniques, materials and/or configurations disclosed. Many modifications and variations are possible in light of this disclosure. For example, while one embodiments may include four memory cells connected to an associated bit line segment, any number of memory cells (including 1, 2, 3, 4, 5, 6, 7, 8, 9 10, 11, etc.) may be associated with a given bit line segment. Thus, it is to be understood that other embodiments may be utilized and operational changes may be made without departing from the scope of the present inventions. The scope of the inventions is not limited solely to the description above, but rather the description of the above embodiments has been presented for the purposes of illustration and description.

Moreover, there are many inventions described and illustrated herein. The present embodiments are neither limited to any single aspect thereof, nor to any combinations and/or permutations of such aspects. Moreover, each of the aspects of the present embodiments may be employed alone or in combination with one or more of the other aspects disclosed. For the sake of brevity, many of those permutations and combinations are not discussed separately herein.

The embodiments described herein are not intended to be exhaustive or to limit the inventions to the precise forms, techniques, materials and/or configurations disclosed. Many modifications and variations are possible in light of the above teaching. It is to be understood that other embodiments may be utilized and operational changes may be made without departing from the scope of the present claimed inventions. As such, the foregoing description of the embodiments of the inventions has been presented for the purposes of illustration and description. Many modifications and variations are possible in light of the above teaching. It is intended that the scope of the inventions not be limited solely to the description above.

It should be noted that the term "circuit" may mean, among other things, a single component (for example, electrical/electronic and/or microelectromechanical) or a multiplicity of components (whether in integrated circuit form or otherwise), which are active and/or passive, and which are coupled together to provide or perform a desired function. The term "circuitry" may mean, among other things, a circuit (whether integrated or otherwise), a group of such circuits, one or more processors, one or more state machines, one or more processors implementing software, or a combination of one or more circuits (whether integrated or otherwise), one or more state machines, one or more processors, and/or one or more processors implementing software. The term "data" may mean, among other things, a current or voltage signal(s) whether in an analog or a digital form.

In general, in the following claims, the terms used should not be construed to limit the method and apparatus to the specific embodiments disclosed in the specification and the claims, but should be construed to include all methods, apparatus, and systems that operate under the claims. Accordingly, the variable memory cell refresh method and apparatus is not limited by the disclosure, but instead the scope of the disclosed method and apparatus is to be determined entirely by the claims.

While certain aspects of the variable memory cell refresh method and apparatus are presented below in certain claim forms, the inventors contemplate the various aspects of the method and apparatus in any number of claim forms. Accordingly, the inventors reserve the right to add additional claims after filing the application to pursue any additional claim forms for other aspects of the variable memory cell refresh method and apparatus.

What is claimed is:

1. A variable memory refresh signal generation circuit, comprising:
   a refresh timer element configurable to generate a periodic memory refresh signal, wherein the memory refresh signal initiates a refresh operation on one or more memory cells; and
   an event signal generator comprising,
      an event detector element configurable to detect a plurality of events that each may change the data retention time of the one or more memory cells, and further configurable to generate an event signal; and
      a timer element coupled to receive the event signal from the event detection element, and further coupled to the refresh timer element to change the interval in response to receiving the event signal.

2. The variable memory refresh signal generation circuit of claim 1, wherein the timer element is configurable to reduce the interval each time the event signal is received.

3. The variable memory refresh signal generation circuit of claim 1, wherein the refresh timer element comprises:
   a first capacitor that stores a potential;
   a resistor coupled between the first capacitor at a first node and a predetermined potential, wherein when the stored potential decays to the predetermined potential, the memory refresh signal is generated; and the refresh timer element further comprises a logic gate whose input is coupled to the first node, and wherein when the stored potential decays to the predetermined potential, the logic gate outputs the memory refresh signal.

4. The variable memory refresh signal generation circuit of claim 3, wherein the timer element comprises:

a second capacitor coupled between a second node and ground;

an event switch coupled between the second node and a predetermined event potential;

a resistor and coupling switch coupled between the second node and the first node, wherein the event switch and the coupling switch are activated by opposite polarities of the event signal, which operates to couple the first capacitor and the second capacitor such that charge is shared between the first capacitor and the second capacitor through a resistance.

5. The variable memory refresh signal generation circuit of claim 4, wherein the charge sharing results in the first capacitor potential decaying at an accelerated rate.

6. The variable memory refresh signal generation circuit of claim 1, wherein the plurality of events comprises disturb events, and wherein the event detector element comprises a disturb summing circuit configured to detect disturb events comprising a Read operation to a row of memory cells, a Write operation to a row of memory cells, and a power glitch.

7. The variable memory refresh signal generation circuit of claim 1, wherein the plurality of events comprises temperature events, voltage events, radiation events, and disturb events, wherein disturb events comprise operations that affect data retention time of memory cells.

8. The variable memory refresh signal generation circuit of claim 7, wherein the disturb events comprise events that affect data retention time of addressed memory cells.

9. The variable memory refresh signal generation circuit of claim 7, wherein the disturb events comprise events that affect data retention time of partially addressed memory cells.

10. The variable memory refresh signal generation circuit of claim 7, wherein the disturb events comprise events that affect data retention time of memory cells neighboring addressed memory cells.

11. The variable memory refresh signal generation circuit of claim 1, wherein the one or more memory cells comprises a memory array.

12. The variable memory refresh signal generation circuit of claim 1, wherein the one or more memory cells comprises a plurality of sub-arrays of a memory array.

13. The variable memory refresh signal generation circuit of claim 1, wherein the one or more memory cells comprises a plurality of portions of a sub-array of a memory array.

14. An integrated circuit device comprising:

a memory cell array having a plurality of memory cells wherein each memory cell stores information in the form of an electrically detectable signal, and wherein one or more of a plurality of events affect the detectable signal; and a plurality of variable memory refresh signal generation circuits each coupled to at least one memory cell, each variable memory refresh signal generation circuit configurable to generate a memory refresh signal at variable intervals, wherein a length of a variable interval is related to an occurrence of one or more of the plurality of events, wherein the plurality of events comprises temperature events, voltage events, radiation events, and disturb events, wherein disturb events comprise operations to memory cells that affect the electrical charge of other memory cells not involved in the operations.

15. The integrated circuit device of claim 14, wherein the memory refresh signal initiates a refresh operation on one or more memory cells, and wherein the length of the variable interval is defined by a decay time required for a potential stored in an element of a variable memory refresh signal generation circuit to decay to a predetermined threshold.

16. The integrated circuit device of claim 15, wherein the decay time is shortened by one or more incremental amounts, wherein the decay time is decreased by an incremental amount each time one of the plurality of events occurs.

17. The integrated circuit device of claim 15, wherein each variable memory refresh signal generation circuit comprises:

a refresh timer element configurable to generate the memory refresh signal at a predetermined interval, wherein the predetermined interval comprises the decay time required for a potential stored in an element of a refresh timer element to decay to a predetermined threshold, and wherein the memory refresh signal initiates a refresh operation on one or more memory cells; and an event signal generator comprising, an event detector element configurable to detect one or more of the plurality of events, and further configurable to generate the event signal; and a timer acceleration element coupled to receive the event signal from the event detection element, and further coupled to the refresh timer element to reduce the decay time by the incremental amount in response to receiving the event signal.

18. The integrated circuit device of claim 17, wherein the plurality of events comprises disturb events, and wherein the event detector element comprises a disturb summing circuit configured to detect disturb events comprising a Read operation to a row of memory cells, a Write operation to a row of memory cells, and a power glitch.

19. The integrated circuit device of claim 14, wherein each variable memory refresh signal generation circuit is coupled to one of a plurality of sub-arrays.

20. The integrated circuit device of claim 14, wherein the refresh timer element comprises:

a first capacitor that stores a potential;

a resistor coupled between the first capacitor at a first node and a predetermined potential, wherein when the stored potential decays to the predetermined threshold, the memory refresh signal is generated; and the refresh timer element further comprises a logic gate whose input is coupled to the first node, and wherein when the stored potential decays to the predetermined threshold, the logic gate outputs the memory refresh signal.

21. The integrated circuit device of claim 20, wherein the timer acceleration element comprises:

a second capacitor coupled between a second node and ground;

an event switch coupled between the second node and a predetermined event potential;

a resistor and coupling switch coupled between the second node and the first node, wherein the event switch and the coupling switch are activated by opposite polarities of the event signal, which operates to couple the first capacitor and the second capacitor such that charge is shared between the first capacitor and the second capacitor.

22. The integrated circuit device of claim 21, wherein the charge sharing results in the first capacitor potential decaying at an accelerated rate.

23. The integrated circuit device of claim 14, wherein each memory cell includes an electrically floating body transistor, wherein the electrically floating body transistor includes:
- a source region;
- a drain region;
- a body region disposed between the source region and the drain region, wherein the body region is electrically floating; and
- a gate disposed over the body region, wherein each memory cell includes (i) a first data state which is representative of a first charge in the body region of the electrically floating body transistor, and (ii) a second data state which is representative of a second charge in the body region of the electrically floating body transistor.

24. A method for initiating a refresh operation on one or more memory cells in a memory array, the method comprising:
- storing a first potential in a refresh timer element, wherein the first potential changes over time;
- coupling the first potential to a threshold potential detector such that the threshold potential detector outputs a timer expired signal when the first potential approaches a predetermined potential;
- detecting one or more of a plurality of events, each of which may change a data retention time of the one or more memory cells; and
- in response to detecting an event, changing the first potential by a predetermined amount.

25. The method of claim 24, further comprising:
- storing a second potential;
- in response to detecting an event, coupling the first potential to the second potential.

26. The method of claim 24, further comprising detecting one or more of a plurality of events that affect a memory array.

27. The method of claim 24, further comprising detecting one or more of a plurality of events that affect a plurality of sub-arrays of a memory array.

28. The method of claim 24, further comprising detecting one or more of a plurality of events that affect a plurality of portions of a sub-array of a memory array.

* * * * *